United States Patent
Kumar et al.

(10) Patent No.: US 9,810,735 B2
(45) Date of Patent: Nov. 7, 2017

(54) CORE TESTING MACHINE

(71) Applicant: Contec, LLC, Schnectady, NY (US)

(72) Inventors: Samant Kumar, San Jose, CA (US); Dinesh Kumar, Bihar (IN); Shivashankar Diddimani, Karnataka (IN); Gunjan Samaiya, Madhya Pradesh (IN)

(73) Assignee: Contec, LLC, Schenectady, NY (US)

( * ) Notice: Subject to any disclaimer, the term of this patent is extended or adjusted under 35 U.S.C. 154(b) by 0 days.

(21) Appl. No.: 14/866,720

(22) Filed: Sep. 25, 2015

(65) Prior Publication Data

US 2017/0089981 A1    Mar. 30, 2017

(51) Int. Cl.
*G06F 11/00* (2006.01)
*G01R 31/317* (2006.01)
*G01R 31/3177* (2006.01)

(52) U.S. Cl.
CPC ... *G01R 31/31715* (2013.01); *G01R 31/3177* (2013.01)

(58) Field of Classification Search
USPC ......................................................... 714/27
See application file for complete search history.

(56) References Cited

U.S. PATENT DOCUMENTS

| | | |
|---|---|---|
| 5,917,808 A | 6/1999 | Kosbab |
| 6,308,496 B1 | 10/2001 | Lee |
| 6,367,032 B1 * | 4/2002 | Kasahara ............ G06F 11/2236 |
| | | 714/25 |
| 6,662,135 B1 | 12/2003 | Burns |
| 6,671,160 B2 | 12/2003 | Hayden |
| 6,859,043 B2 | 2/2005 | Ewing |
| 7,664,317 B1 | 2/2010 | Sowerby |
| 8,121,028 B1 | 2/2012 | Schlesener |
| 8,209,732 B2 * | 6/2012 | Le ......................... H04N 17/00 |
| | | 348/180 |
| 8,229,344 B1 | 7/2012 | Petersen |
| 8,324,909 B2 | 12/2012 | Oakes et al. |
| 8,418,000 B1 | 4/2013 | Salame |
| 8,418,219 B1 * | 4/2013 | Parsons ............... H04N 17/004 |
| | | 348/180 |
| 8,515,015 B2 | 8/2013 | Maffre |
| 8,689,071 B2 | 4/2014 | Valakh |
| 8,806,400 B1 | 8/2014 | Bhawmik |
| 9,013,307 B2 | 4/2015 | Hussain |
| 9,316,714 B2 | 4/2016 | Rada |
| 9,319,908 B2 | 4/2016 | Nickel |

(Continued)

FOREIGN PATENT DOCUMENTS

| | | |
|---|---|---|
| CN | 202261360 | 5/2012 |
| WO | 0113604 | 2/2001 |

(Continued)

OTHER PUBLICATIONS

Kumar, Samant; Issue Notification for U.S. Appl. No. 14/866,780, filed Sep. 25, 2015, dated Oct. 19, 2016, 1 pg.

(Continued)

*Primary Examiner* — Kamini Patel
(74) *Attorney, Agent, or Firm* — Taylor English Duma LLP

(57) ABSTRACT

A core testing executor/processor for testing a plurality of devices simultaneously using virtualization containers to connect to interfaces of corresponding devices under test is disclosed.

11 Claims, 2 Drawing Sheets

A Particular Test Execution

(56) References Cited

U.S. PATENT DOCUMENTS

| | | | |
|---|---|---|---|
| 9,372,228 B2 | 6/2016 | Nickel | |
| 9,402,601 B1 | 8/2016 | Berger | |
| 9,490,920 B2 | 11/2016 | Parte | |
| 9,491,454 B1 | 11/2016 | Kumar | |
| 9,571,211 B2 | 2/2017 | Partee | |
| 2002/0070725 A1* | 6/2002 | Hilliges | G01R 31/31907 714/724 |
| 2003/0005380 A1* | 1/2003 | Nguyen | G06F 11/273 714/736 |
| 2003/0184035 A1 | 10/2003 | Yu | |
| 2004/0010584 A1 | 1/2004 | Peterson | |
| 2004/0016708 A1 | 1/2004 | Rafferty | |
| 2004/0160226 A1 | 8/2004 | Ewing | |
| 2005/0041642 A1 | 2/2005 | Robinson | |
| 2005/0053008 A1 | 3/2005 | Griesing | |
| 2005/0102488 A1 | 5/2005 | Bullis | |
| 2005/0193294 A1* | 9/2005 | Hildebrant | G01R 31/2886 714/723 |
| 2005/0286466 A1 | 12/2005 | Tagg | |
| 2006/0015785 A1* | 1/2006 | Chun | G01R 31/31924 714/724 |
| 2006/0271322 A1 | 11/2006 | Haggerty | |
| 2007/0097659 A1 | 5/2007 | Behrens | |
| 2007/0220380 A1* | 9/2007 | Ohanyan | G01R 31/31726 714/724 |
| 2008/0117907 A1 | 5/2008 | Hein | |
| 2008/0144293 A1 | 6/2008 | Aksamit | |
| 2008/0168520 A1 | 7/2008 | Vanderhoff | |
| 2008/0315898 A1 | 12/2008 | Cannon | |
| 2009/0089854 A1 | 4/2009 | Le | |
| 2009/0282446 A1 | 11/2009 | Breed | |
| 2009/0282455 A1 | 11/2009 | Bell et al. | |
| 2009/0289020 A1 | 11/2009 | Wurmhoringer | |
| 2010/0132000 A1 | 5/2010 | Straub | |
| 2010/0138823 A1* | 6/2010 | Thornley | G06F 9/455 717/174 |
| 2010/0246416 A1 | 9/2010 | Sinha | |
| 2011/0001833 A1 | 1/2011 | Grinkemeyer | |
| 2011/0006794 A1 | 1/2011 | Sellathamby | |
| 2011/0012632 A1 | 1/2011 | Merrow | |
| 2011/0035676 A1 | 2/2011 | Tischer | |
| 2011/0072306 A1 | 3/2011 | Racey | |
| 2011/0099424 A1* | 4/2011 | Rivera Trevino | G06F 11/263 714/25 |
| 2011/0116419 A1 | 5/2011 | Cholas | |
| 2011/0222549 A1 | 9/2011 | Connelly | |
| 2011/0306306 A1 | 12/2011 | Reed | |
| 2012/0140081 A1 | 1/2012 | Clements | |
| 2012/0163227 A1 | 6/2012 | Kannan | |
| 2012/0198084 A1 | 8/2012 | Keskitalo | |
| 2012/0198442 A1* | 8/2012 | Kashyap | G06F 8/61 718/1 |
| 2012/0220240 A1 | 8/2012 | Rothschild | |
| 2012/0275784 A1 | 11/2012 | Soto | |
| 2012/0278826 A1 | 11/2012 | Jones | |
| 2013/0033279 A1 | 2/2013 | Sozanski | |
| 2013/0076217 A1 | 3/2013 | Thompson | |
| 2013/0093447 A1 | 4/2013 | Nickel | |
| 2013/0104158 A1* | 4/2013 | Partee | H04H 60/32 725/14 |
| 2013/0160064 A1* | 6/2013 | van Rozen | H04N 21/4433 725/110 |
| 2013/0167123 A1* | 6/2013 | Dura | G06F 11/3664 717/127 |
| 2014/0115580 A1* | 4/2014 | Kellerman | H04N 21/4437 718/1 |
| 2014/0123200 A1* | 5/2014 | Park | H04N 21/8173 725/110 |
| 2014/0156819 A1 | 6/2014 | Cavgalar | |
| 2014/0187172 A1 | 7/2014 | Partee | |
| 2014/0187173 A1* | 7/2014 | Partee | H04B 17/00 455/67.12 |
| 2014/0207404 A1 | 7/2014 | Fritzsche | |
| 2014/0256373 A1 | 9/2014 | Hernandez | |
| 2014/0266930 A1 | 9/2014 | Huynh | |
| 2014/0282783 A1 | 9/2014 | Totten | |
| 2014/0370821 A1 | 12/2014 | Guterman | |
| 2015/0024720 A1 | 1/2015 | Efrati | |
| 2015/0093987 A1 | 4/2015 | Duyang Yuehui | |
| 2015/0109941 A1 | 4/2015 | Zhang | |
| 2015/0151669 A1 | 6/2015 | Meisner | |
| 2015/0226716 A1 | 8/2015 | Nelson | |
| 2015/0237010 A1 | 8/2015 | Roskind | |
| 2015/0253357 A1 | 9/2015 | Olgaard | |
| 2015/0369851 A1 | 12/2015 | Even | |
| 2016/0080241 A1 | 3/2016 | Rocha De Maria | |
| 2016/0102951 A1 | 4/2016 | Cole | |
| 2016/0191364 A1 | 6/2016 | Ajitomi | |
| 2016/0381818 A1 | 12/2016 | Mills | |
| 2017/0048519 A1 | 2/2017 | Friel | |
| 2017/0093682 A1 | 3/2017 | Kumar | |
| 2017/0093683 A1 | 3/2017 | Kumar | |
| 2017/0126536 A1 | 5/2017 | Kumar | |
| 2017/0126537 A1 | 5/2017 | Kumar | |
| 2017/0126539 A1 | 5/2017 | Tiwari | |
| 2017/0149635 A1 | 5/2017 | Kumar | |
| 2017/0149645 A1 | 5/2017 | Kumar | |
| 2017/0195071 A1 | 7/2017 | Kumar | |

FOREIGN PATENT DOCUMENTS

| | | |
|---|---|---|
| WO | 2013169728 | 11/2013 |
| WO | 2017053961 | 3/2017 |
| WO | 2017074872 | 5/2017 |

OTHER PUBLICATIONS

Kumar, Samant; Notice of Allowance for U.S. Appl. No. 14/866,780, filed Sep. 25, 2015, dated Jul. 19, 2016, 8 pgs.

Kumar, Samant; Notice of Allowance for U.S. Appl. No. 14/987,538, filed Jan. 4, 2016, dated Mar. 23, 2017, 12 pgs.

Kumar, Samant; Non-Final Office Action for U.S. Appl. No. 15/057,085, filed Feb. 29, 2016, dated Apr. 7, 2017, 15 pgs.

Kumar, Samant; International Search Report and Written Opinion for PCT/US16/53768, filed Sep. 26, 2016, dated Feb. 3, 2017, 17 pgs.

Nordman, Bruce, "Testing Products with Network Connectivity," Jun. 21, 2011 [retrieved online at http://citeseerx.is1.psu.edu/viewdoc/download?doi=10.1.1.695.772&rep=rep1&type=pdf on Feb. 6, 2017], 20 pgs.

Kumar, Samant; International Search Report and Written Opinion for PCT/US2016/058507, filed Oct. 24, 2016, dated Jan. 3, 2017, 12 pgs.

Kumar, Samant; Non-Final Office Action for U.S. Appl. No. 14/866,630, filed Sep. 25, 2015, dated Mar. 9, 2017, 24 pgs.

Kumar, Samant; Ex-Parte Quayle Office Action for U.S. Appl. No. 14/948,925, filed Nov. 23, 2015, dated Jun. 20, 2017, 29 pgs.

Kumar, Samant; Non-Final Office Action for U.S. Appl. No. 14/987,538, filed 114/2016, dated Jul. 21, 2017, 18 pgs.

Kumar, Samant; Non-Final Office Action for U.S. Appl. No. 15/624,961, filed Jun. 16, 2017, dated Jul. 19, 2017, 7 pgs.

Businesswire; Article entitled: "Genband and CTDI Settle Legal Dispute", located at <http://www.businesswire.com/news/home/20140321005528/en/Genband-CTDI-Settle-Legal-Dispute>, Mar. 21, 2014, 1 pg.

CED Magazine; Article entitled: "Cable Connects in Atlanta", located at <https://www.cedmagazine.com/article/2006/04/Gable-connects-atlanta>, Apr. 30, 2006, 21 pgs.

Digital Producer; Article entitled: "S3 Group Unveils Exclusive Partnership in North America With First US StormTest(TM) Decision Line Customer", located at <http://www.digitalproducecom/article/S3-Group-Unveils-Exclusive-Partnership-in-North-America-With-First-US-StormTest(TM)-Decision-Line-Customer—1668213>, Sep. 8, 2011, 3 pgs.

Electronic Design; Article entitled: "Testing of MPEG-2 Set-Top Boxes Must be Fast, Thorough", located at <http://www.electronicdesign.com/print/839>, published Nov. 18, 2001, 9 pgs.

(56) References Cited

OTHER PUBLICATIONS

Euromedia; Article entitled: "Automated TV Client testing: Swisscom partners with S3 Group to deliver the ultimate IPTV experience", located at <http://advanced-television.com/wp-content/uploads/2012/10/s3.pdf>, earliest known publication date—May 30, 2013, 2 pgs.

Promptlink; Article entitled: "Set-Top Box Test Platform", located at <http://promptlink.com/products/stbtp.html>, earliest known publication date Aug. 11, 2016, 7 pgs.

Promptlink Communications; Article entitled: "Promptlink Communications Officially Launches Sep-Top Box Testing Platform", located at <https://www.promptlink.com/companyfassets/media/2014-05-20.pdf>, published on May 20, 2014, 2 pgs.

S3 Group; Document entitled: "White Paper: The Importance of Automated Testing in Set-Top Box Integration", earliest known publication date Jun. 17, 2014, 11 pgs.

Teleplan; Article entitled: "Screening & Testing", located at <https://www.teleplan.com/innovative-services/screening-testing/>, earliest known publication date Mar. 21, 2015, 7 pgs.

TVTechnology; Article entitled: "S3 Group's StormTest", located at <http://www.tvtechnology.com/expertise/0003/s3-groups-stormtest/256690>, published May 1, 2012, 2 pgs.

Kumar, Samant; Non-Final Office Action for U.S. Appl. No. 14/929,180, filed Oct. 30, 2015, dated Sep. 22, 2017, 32 pgs.

Kumar, Samant; Non-Final Office Action for U.S. Appl. No. 14/929,220, filed Oct. 30, 2015, dated Aug. 24, 2017, 31 pgs.

\* cited by examiner

CORE TESTING MACHINE

CROSS REFERENCE TO RELATED APPLICATIONS

This application is related to U.S. patent application Ser. No. 14/866,630, filed Sep. 25, 2015, published as U.S. Patent Publication No. 2017/0093682 and entitled, "Universal Device Testing System," by Samant Kumar et al., and to U.S. patent application Ser. No. 14/866,752, filed Sep. 25, 2015, published as U.S. Patent Publication No. 2017/0093683 and entitled, "Universal Device Testing Interface," by Samant Kumar et al., and to U.S. patent application Ser. No. 14/866,780, filed Sep. 25, 2015, now U.S. Pat. No. 9,491,454 and entitled, "Set Top Boxes Under Test," by Samant Kumar et al., and to U.S. patent application Ser. No. 14/948,143, filed Nov. 20, 2015 and entitled, "Cable Modems/eMTAs Under Test," by Samant Kumar et al., each of which is hereby incorporated by reference in its entirety. This application is also related to U.S. patent application Ser. No. 14/948,925, filed Nov. 23, 2015 and entitled, "Wireless Routers Under Test," by Samant Kumar et al., and to U.S. patent application Ser. No. 14/929,180, filed Oct. 30, 2015 and entitled, "Hardware Architecture for Universal Testing System: Cable Modem Test," by Samant Kumar et al., and to U.S. patent application Ser. No. 14/929,220, filed Oct. 30, 2015 and entitled, "Hardware Architecture for Universal Testing System: Wireless Router Test," by Samant Kumar et al., and to U.S. patent application Ser. No.14/987,538, filed Jan. 4, 2016 and entitled, "Test Sequences Using Universal Testing System."

TECHNICAL FIELD

The present invention is directed to a system for testing devices.

DETAILED DESCRIPTION

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

According to certain embodiments, a core testing machine comprises multiple slots for installing a DUT in each slot. As a non-limiting example, each DUT in a respective slot is associated with its respective lightweight virtualization containers (probes abstraction) and core testing executor/processor. For example, the core testing machine may comprise N core testing servers and each of the N core testing servers may be associated with M core testing executors/processors. According to certain embodiments, the core testing machine need not have every slot installed with a DUT in order to begin running the tests. The slots are used as needed. Further, the testing of a given DUT can start and finish independently of the other DUTs installed in the test bench of the core testing machine.

Non-limiting examples of devices under test (DUTs) include set top boxes, cable modems, embedded multimedia terminal adapters, and wireless routers including broadband wireless routers for the home or for commercial networks.

Figure 1:
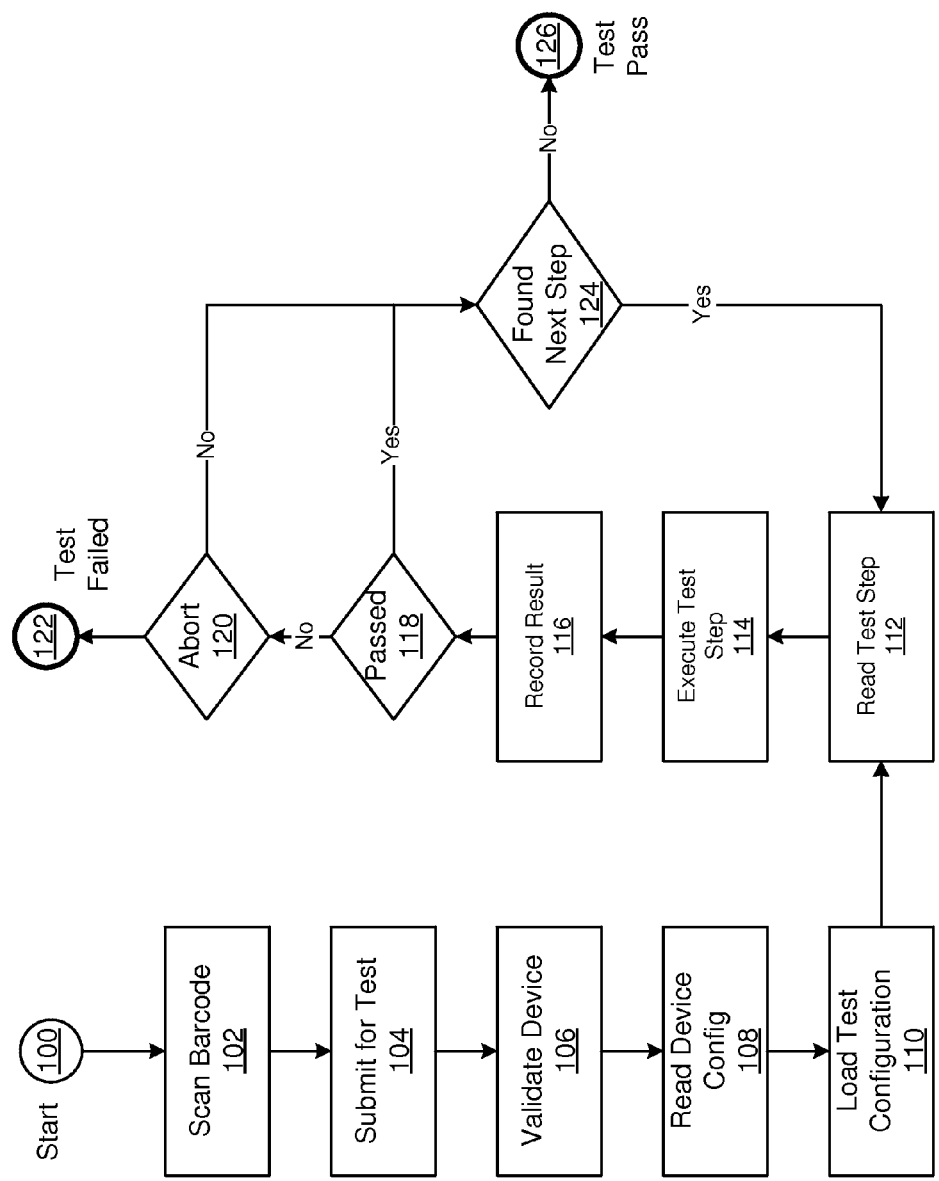
FIG. 1 a high-level flow chart that illustrates some steps performed by a core testing executor/processor for testing devices, according to certain embodiments.

According to certain embodiments, FIG. 1 a high-level flow chart that illustrates some steps performed by a core testing executor/processor for testing devices, according to certain embodiments. According to certain embodiments, the core testing executor/processor is associated with a server. According to certain other embodiments, the core testing executor is special processor. At block 100, a user installs one or more devices to be tested into test bench of the core testing machine for testing the devices. According to certain embodiments, at block 102, the user scans the barcode (or other identification) of each device to be tested. A device that is to be tested using the core testing executor/processor is also referred to as "DUT" herein. Each DUT is then submitted for testing at block 104. For purposes of convenience, FIG. 1 will be described with respect to a single DUT even though the core testing machine is capable of testing multiple DUTs simultaneously. For a given DUT, the respective core testing executor/processor receives a corresponding serial number information and validates the corresponding DUT at block 106. At block 108, the core testing executor/processor retrieves device information such as make, model, customer, etc. of a given DUT based on the serial number information from a database or web service, for example. At block 110, the core testing executor/processor loads the specific test configuration information corresponding to the given DUT. Each DUT type (based on make, model, etc) may be associated with different test configuration information. Each test configuration information includes a set of testing steps. At block 112, the core testing executor/processor begins to read a testing step of the test configuration information for a given DUT. At block 114, the core testing executor/processor executes the test step that was read at block 112. At block 116, the core testing executor/processor records the result of the executed test step. At block 118, the core testing executor/processor determines whether the DUT passed or failed the executed test step. If the DUT failed the executed test step at block 118, then the core testing executor/processor determines whether to abort the testing procedure (based on the test configuration) at block 120. If the core testing executor/processor determines to abort the testing procedure at block 120, then the DUT is deemed to have failed the test step at block 122. If the core testing executor/processor determines not to abort the testing procedure at block 120, or if the DUT passed the executed test step at block 118, then control passes to block 124 where the core testing executor/processor determines whether there is another test step to be executed from the set of testing steps for the given DUT. If it is determined that there is another test step to be executed, then control passes back to block 112. If it is determined that there are no more test steps in the set of test steps to be executed for the given DUT, then the DUT is deemed to have passed the test procedure, according to certain embodiments of the invention. Upon completion of each test step for a given DUT, a message of the completion and/or the results of the test step is sent to the user's browser via web-sockets in real-time, for example. Thus, the user interface can show test progress in addition to testing information such as port numbers, IP address for each DUT slot, DUT serial number, and testing preferences related to billing and pushing to the cloud, etc. The use can also provide input associated with a given test (e.g., password). The user (via user interface) can communicate with the core testing executor/processor using asynchronous feedback and interaction. As a non-limiting example, communication may be in the form of JSON messages using TCP/IP protocol, according to certain embodiments. JSON is Java script object notation for transmitting data between the server and web applications.

According to certain embodiments, the core testing machine can test a set of similar types of devices or disparate types of devices simultaneously using a separate set of interfaces for each device that is under test testing. As a non-limiting example, there may be N core testing servers. Each N core testing server may comprise M number of core testing executors/processors. Thus, a total of N multiplied by M number of DUTS can be tested simultaneously (one DUT is each of the N×M slots, for example). According to certain embodiments, the use of DUT testing interfaces (probes) through virtualization containers can avoid network conflicts while testing multiple DUTs simultaneously by the core testing machine. According to certain embodiments, the core testing servers and core testing executors/processors (and other components) in the testing system may be distributed over a plurality of computers.

Figure 2:
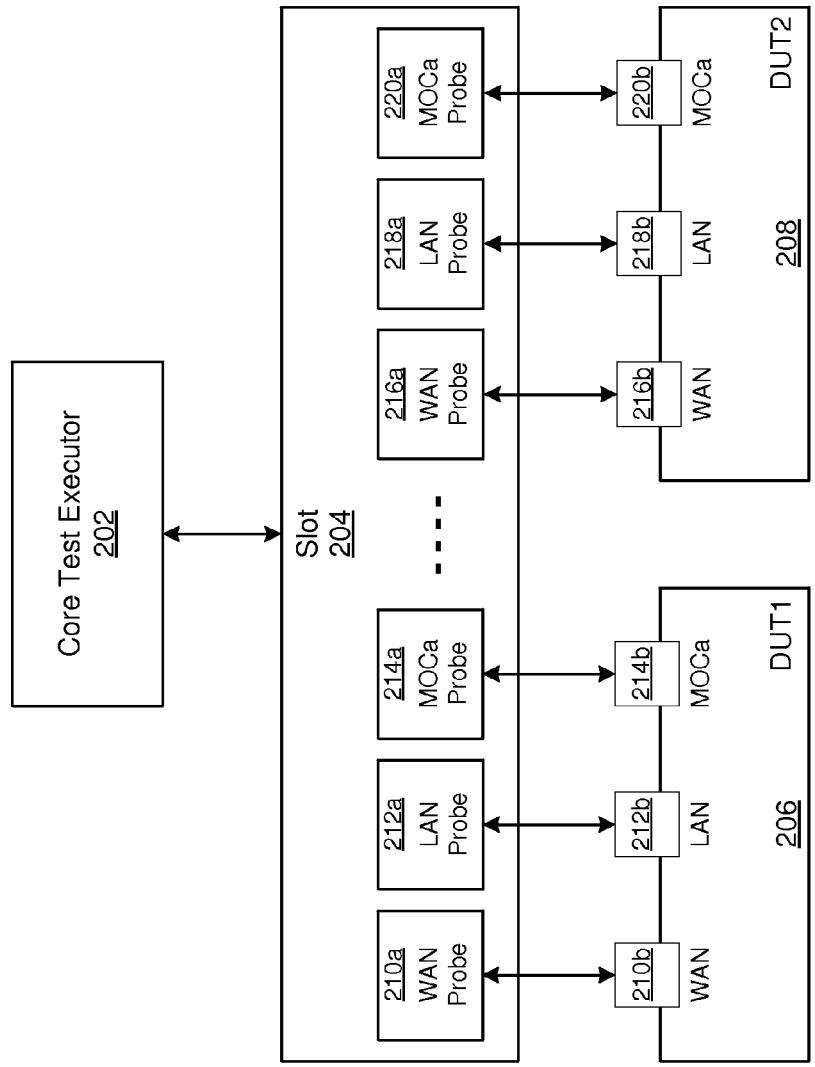
FIG. 2 is a high-level schematic that illustrates DUT probes through the use of virtualization containers, according to certain embodiments.

FIG. 2 is a high-level schematic that illustrates DUT probes through the use of software containers (virtualization containers), according to certain embodiments. FIG. 2 shows core test executor/processor 202, slot 204, and DUTs 206 and 208. There may be more than two DUTs but only two of them are shown in FIG. 2 for convenience. Slot 204 includes as non-limiting examples, Ethernet wide area network (WAN) probes 210a, 216a, Ethernet local area network (LAN) probes 212a, 218a and a multimedia over coax alliance (MoCA) probes 214a, 220a (MoCA probes can be WAN or LAN, for example). Depending on the nature of the DUT and the DUT's corresponding test configuration, there may also be wireless probes via antenna (Wifi probes, for example). Slot 204 are connected to the interfaces of DUT 206 and DUT 208 respectively. For example, WAN probe 210a is connected to WAN port 210b of DUT 206. LAN probe 212a is connected to LAN port 212b of DUT 206. MoCA probe 214a is connected to MoCA port 214b of DUT 206. Similarly, WAN probe 216a is connected to WAN port 216b of DUT 208. LAN probe 218a is connected to LAN port 218b of DUT 208. MoCA probe 220a is connected to MoCA port 220b of DUT 208.

Probes test the following interfaces on the DUT (when such interfaces are available on the DUT):
- Ethernet Local Area Network (LAN): assigned probe runs Ethernet-based connection and speed tests
- Ethernet Wide Area Network (WAN): assigned probe runs Ethernet-based connection and speed tests
- Multimedia over Coax Alliance (MoCA) LAN: assigned probe sets up MoCA connection, establishes connection, and runs MoCA-related connection and speed tests
- MoCA WAN: assigned probe sets up MoCA connection, establishes connection, and runs MoCA-related connection and speed tests
- Wireless 2.4 GHz: assigned probe sets up wireless connection, establishes connection, and runs WiFi-related connection tests on 2.4 GHz frequency
- Wireless 5.0 GHz: assigned probe sets up wireless connection, establishes connection, and runs WiFi-related connection tests on 5.0 GHz frequency
- Phone ports (FXS): assigned probe sets up phone service simulation, establishes connection, and runs phone-based connection tests
- USB: assigned probe runs USB-functionality tests
- Video: assigned probe runs video-related tests
- Audio: assigned probe runs audio-related tests According to certain embodiments, when executing a specific test for a given DUT, the core testing executor/processor loads and reads test configuration information (for example from an XML structure) and identifies the relevant test script that needs to be executed. Inputs that are needed for executing the relevant test script are retrieved and supplied as inputs to the relevant test script. The following is a non-limiting sample scripts.

Create DUT object & Environment Object
Verify Serial Number
Verify Warranty
Check Report Server
Check DUT Staging
    Checks for DUT Serial number in Database or Webservice
Get DUT Readiness Information
    Checks Webservice for test readiness status of DUT in the test process
Configure container Environment
Clear Environment Temp Files
Analyze DUT for Factory Reset
    Checks ability to login to DUT
    Asks operator to manually Factory Reset if unable to login
Confirm Factory Reset (if needed)
    Waits for operator to confirm that DUT was factory reset and booted up properly
Check Ethernet LAN connections to DUT
    Ping connections: Eth LAN 1, 2, 3, 4
    Fails if any ping to these connections fail
Detect DUT
    Checks connection to DUT through socket connection
Reset Password
    Operator scans password which is stored temporarily for use in the remainder of test until finished
Login to GUI
    Done through web-scraping
Get DUT Information and compare values
    Information retrieved through web-scraping
Enable Telnet
    Enables telnet on DUT through web-scraping
Factory Reset
    Factory resets DUT through telnet command
Enable Telnet after Factory Reset
    Enables telnet on DUT through web-scraping
Confirm Power, WAN Ethernet, and Internet LEDs
Confirm all LAN Ethernet LEDs
Confirm WiFi LED Configure Wireless Network
  Through telnet commands
  Sets N Mode
  Enables Privacy
  Sets WPA (Wi-Fi Protected Access)
  Removes WEP (Wired Equivalent Privacy)
  Assigns WiFi Channel to DUT (channel different by slot)
  [Channel 1: slots 1, 4, 7, 10, 13, 16]
  [Channel 6: slots 2, 5, 8, 11, 14]
  [Channel 11: slots 3, 6, 9, 12, 15]
  Verifies changes through GUI
  Disables WiFi once done through telnet
Check Firmware Version and Upgrade Firmware (if needed)
  Firmware version: 40.21.18
Cage Closed Confirmation Check
  Asks Operator to Close Door on Cage
Connect Wireless Card
  Waits on shared Resource Server (located on TC) for Resource L2 (Layer 2) Lock
    Lock waiting timeout: 600 sec
    All L2 Locks are able to run in parallel but not when any L3 (Layer 3) Lock is running
    Obtains Lock
    Enables WiFi through telnet
    Set WiFi Card
    Total Retries allowed: 6 (2 sets of 3 retries)
    Ping WiFi from DUT
    L2 ARP Test on WiFi: must receive 10/10 ARP packets
    Total Retries allowed: 6 (2 sets of 3 retries)
    If either Set WiFi Card or L2 ARP Test Fail after its 3 retries, Ask Operator to Check Antennas
    Performs one more retry in full (set of 3 retries each for Set WiFi Card and L2 ARP Wifi Test) after Check Antennas
    Disables WiFi through telnet
    Releases Lock
Wireless to LAN Ethernet Speed Test
  Waits on shared Resource Server (located on TC) for Resource L3 Lock
    Lock waiting timeout: 1800 sec
    L3 Locks must be run one at a time and when no L2 Lock is running
    Obtains Lock
    Enables WiFi through telnet
    Connects WiFi Card
    Iperf3 Speed Test, 5 seconds for UDP Speed Test, 7 seconds for TCP Speed Test, Sending 200 Mbps Bandwidth
    Bandwidth must be greater than 60 Mbps on TCP (Reverse) or 70 Mbps on UDP (Forward)
    If Fail after 2 retries, ask operator to Check Antennas
    Retries up to 2 times more if still Fail
    Therefore, Total Retries allowed: 4 (2 sets of 2 retries)
    Runs sudo iwlist wlan0 scan and returns all Wireless Signals seen
    Results parsed to print all visible SSIDs and its matching Signal level
    Disables WiFi through telnet
    Releases Lock
Confirm WPS LED
Confirm LAN Coax LED
Confirm USB 1+2 LEDs
Configure WAN MoCA
Confirm WAN Coax LED
Ping WAN MoCA
L2 Test on LAN Ethernet
  Arp Test from Eth LAN 1 to Eth LAN 2, 3, 4
  Must receive 10/10 on all LAN connections
LAN Ethernet to LAN Ethernet Speed Test
  From Eth LAN 1 to Eth LAN 2, 3, 4
  Iperf3 Speed Test, 5 seconds Reverse and Forward, Sending 1200 Mbps Bandwidth
  Bandwidth must be greater than 700 Mbps
  Total Retries allowed: 2
Check WAN and LAN MoCA Data Rates
  Rx and Tx Data rates for both WAN and LAN MoCA retrieved through telnet
  All Rates must be greater than 180 Mbps
LAN Ethernet to WAN MoCA FTP Speed Test
  From Eth LAN 1 to WAN MoCA
  Iperf3 Speed Test, 5 seconds Reverse and Forward, Sending 1200 Mbps Bandwidth
  Bandwidth must be greater than 60 Mbps
  Total Retries allowed: 2
LAN MoCA to LAN Ethernet FTP Speed Test
  From Eth LAN 1 to LAN MoCA
  Iperf3 Speed Test, 5 seconds Reverse and Forward, Sending 240 Mbps Bandwidth
  Bandwidth must be greater than 60 Mbps
  Total Retries allowed: 2
LAN MoCA to WAN MoCA FTP Speed Test
  From LAN MoCA to WAN MoCA
  Iperf3 Speed Test, 5 seconds Reverse and Forward, Sending 240 Mbps Bandwidth
  Bandwidth must be greater than 60 Mbps
  Total Retries allowed: 2
Enable WAN Ethernet
  Through telnet command
LAN Ethernet to WAN Ethernet FTP Speed Test
  From Eth LAN 1 to Eth WAN
  Iperf3 Speed Test, 5 seconds Reverse and Forward, Sending 1200 Mbps Bandwidth
  Bandwidth must be greater than 700 Mbps
  Total Retries allowed: 2
Clear Persistent Logs
Final Factory Restore According to certain embodiments, the core testing executor/processor uses a reflection and command design pattern to invoke the relevant configured script(s) corresponding to each DUT being tested. For example, in the command design pattern one or more of the following are encapsulated in an object: an object, method name, arguments. According to certain embodiments, the core testing executor/processor uses the Python "reflection" capability to execute the relevant test scripts for a given DUT. The core testing executor/processor is agnostic of the inner workings of the relevant test scripts for a given DUT.

According to certain embodiments, lightweight software containers are used to abstract the connection of probes to the different DUT interfaces in order to avoid conflicts. Non-limiting examples of virtualization containers are Linux containers. As a non-limiting example, Linux container is an operating-system-level virtualization environment for running multiple isolated Linux systems (containers) on a single Linux control host. In other words, lightweight software containers are used to ensure isolation across servers. By using containers, resources can be isolated, services restricted, and processes provisioned to have an almost completely private view of the operating system with their own process ID space, file system structure, and network interfaces. Multiple containers share the same kernel, but each container can be constrained to only use a defined amount of resources such as CPU, memory, network resources and I/O. The relevant test script might need to connect to the DUT interfaces directly or through the virtualization containers to execute the tests. The core testing executor/processor receives the test results from running the relevant test scripts. The core testing executor/processor can further process and interpret such results and can also send the results to the user's browser via web sockets. According to certain embodiments, the respective core testing executors/processors are in communication (e.g., Telnet/SSH) with the virtualization containers (there may be multiple virtualization containers). The containers/probes are in communication with corresponding DUT interfaces using Telnet/SSH/TCP/UDP/HTTP/HTTPS etc, as non-limiting examples.

According to certain embodiments, a system for testing device comprises: a testing machine with a plurality of slots, wherein each slot of the plurality of slots is for installing a device-under-test (DUT) of a plurality of DUTs; a plurality of core testing processors, wherein each core testing processor of the plurality of core testing processors is associated with a respective slot of the plurality of slots; a plurality of lightweight virtualization containers, where a respective lightweight virtualization container of the plurality of lightweight virtualization containers is associated with one of the slots that might have DUT installed, wherein the plurality of lightweight virtualization containers enable isolation of respective testing processes and testing resources associated with each respective device-under-test.

According to certain embodiments, the plurality of lightweight virtualization containers comprise testing probes for testing a respective DUT of the plurality of DUTs. Virtualization containers can also be referred to as probes herein.

According to certain embodiments, the plurality of lightweight virtualization containers are used for testing one or more DUT interfaces at the DUT comprising: Ethernet Local Area Network (LAN) interface; Ethernet Wide Area Network (WAN) interface; Multimedia over Coax Alliance (MoCA) LAN interface; Multimedia over Coax Alliance (MoCA) WAN interface; Wireless 2.4 GHz interface; Wireless 5.0 GHz interface; Phone ports (FXS) interface; USB interface; video interface; and audio interface According to certain embodiments, each core testing processor of at least a subset of the plurality of core testing processors is associated with a respective web socket for communication that is isolated and independent of communication associated with other core testing processors of the plurality of core testing processors.

According to certain embodiments, a respective core testing processor of the plurality of core testing processors communicates with a user interface.

According to certain embodiments, a respective core testing processor of the plurality of core testing processors communicates using asynchronous feedback and interaction.

According to certain embodiments, a respective core testing processor of the plurality of core testing processors communicates using JSON messages.

According to certain embodiments, the respective core testing processor of the plurality of core testing processors communicates using TCP/IP protocol.

According to certain embodiments, the respective core testing processor of the plurality of core testing processors: retrieves at run time a respective test configuration corresponding to the DUT installed in the respective slot associated with respective core testing processor; loads the set of tests associated with the DUT installed in the respective slot associated with respective core testing processor; and executes the loaded set of tests.

In the foregoing specification, embodiments of the invention have been described with reference to numerous specific details that may vary from implementation to implementation. The specification and drawings are, accordingly, to be regarded in an illustrative rather than a restrictive sense.

We claim:

1. A system for testing devices, the system comprising:
   a testing machine with a plurality of slots, wherein each slot of the plurality of slots is for installing a device-under-test (DUT) of a plurality of DUTs;
   a plurality of core testing processors, wherein each core testing processor of the plurality of core testing processors communicates with a user interface and is associated with a respective slot of the plurality of slots, and wherein each core testing processor of at least a subset of the plurality of core testing processors is associated with a respective web socket for communication that is isolated and independent of communication associated with other core testing processors of the plurality of core testing processors; and
   a plurality of lightweight virtualization containers, where a respective lightweight virtualization container of the plurality of lightweight virtualization containers is associated with an interface of a DUT that is installed for testing, wherein the plurality of lightweight virtualization containers enable isolation of respective testing processes and testing resources associated with each respective DUT;
   wherein a respective core testing processor of the plurality of core testing processors retrieves at run time a respective test configuration corresponding to the DUT installed in the respective slot associated with a respective core testing processor,
      loads the set of tests associated with the DUT installed in the respective slot associated with respective core testing processor, and
      executes the loaded set of tests.

2. The system of claim 1, wherein the plurality of lightweight virtualization containers comprise testing probes for testing corresponding interfaces of a respective DUT of the plurality of DUTs.

3. The system of claim 1; wherein the plurality of lightweight virtualization containers are used for testing one or more DUT interfaces at the DUT, each of the interfaces comprising at least one of:
   an Ethernet Local Area Network (LAN) interface; an Ethernet Wide Area Network (WAN) interface; a Multimedia over Coax Affiance (MoCA) LAN interface; a Multimedia over Coax Alliance (MoCA) WAN interface; a Wireless 2.4 GHz interface; a Wireless 5.0 GHz interface; a Foreign exchange Subscriber ports (FXS) interface; a Universal Serial Bus (USB) interface; a video interface; and an audio interface.

4. The system of claim 1, wherein the respective core testing processor of the plurality of core testing processors communicates using asynchronous feedback and interaction.

5. The system of claim 1, wherein the respective core testing processor of the plurality of core testing processors communicates using Java script object notation (JSON) messages.

6. The system of claim 1, wherein the respective core testing processor of the plurality of core testing processors communicates using TCP/IP protocol.

7. A method for testing devices, comprising the steps of: scanning identification information associated with each device under test (DUT) of a plurality of devices under test;

validating each DUT by receiving, at a core executor, serial number information for each DUT;

retrieving, at the core executor, from a source selected from a database and a web service, type information comprising a make and/or model of each DUT, retrieval of the type information based upon the serial number information; loading, at the core executor, test configuration information specific to each type of DUT; reading a test step of the test configuration information loaded for each DUT; executing the test step read for each DUT;

determining whether each DUT passed or faded the executed test step; responsive to a determination that a DUT passed the executed test step, determining whether, for each DUT that passed the executed test step, the loaded test configuration information contains a next test step to be executed; responsive to a determination that the loaded test configuration contains a next test step to be executed, repeating, for each DUT for which a next test step exists, the steps of reading the test step, executing the test step read for each DUT, determining whether each DUT passed the executed test step, and determining whether, for each DUT that passed the executed test step, the loaded test configuration information contains a next step to be executed; and responsive to a determination that the loaded test configuration does not contain a next test step to be executed, terminating the repeating step for each DUT for which a next test step does not exist.

8. The method of claim 7, further comprising the steps of: responsive to a determination that a DUT faded the executed test step, determining whether to abort testing for each DUT that failed the executed test step; and responsive to a determination to not abort testing, executing the repeating step until reaching the determination that the loaded test configuration does not contain a next test step to be executed.

9. The method claim 8, further comprising the step of, responsive to a determination to abort testing, indicating testing failure for each DUT for which a determination to abort testing has been made.

10. The method of claim 8, further comprising the step of communicating, upon completion of each test step, results of the completed test step to a user.

11. The method of claim 10, wherein the step of communicating comprises sending a message to a browser of the user via web-sockets.

* * * * *

UNITED STATES PATENT AND TRADEMARK OFFICE
CERTIFICATE OF CORRECTION

PATENT NO. : 9,810,735 B2
APPLICATION NO. : 14/866720
DATED : November 7, 2017
INVENTOR(S) : Samant Kumar et al.

It is certified that error appears in the above-identified patent and that said Letters Patent is hereby corrected as shown below:

In the Specification

In Column 1, replace the entire CROSS REFERENCE TO RELATED APPLICATIONS with the following:

This application is related to U.S. patent application Serial No. 14/866,630, filed September 25, 2015, published as U.S. Patent Publication No. 2017/0093682 and entitled, "Universal Device Testing System," by Samant Kumar et al., and to U.S. patent application Serial No. 14/866,752, filed September 25, 2015, published as U.S. Patent Publication No. 2017/0093683 and entitled, "Universal Device Testing Interface," by Samant Kumar et al., and to U.S. patent application Serial No. 14/866,780, filed September 25, 2015, now U.S. Patent No. 9,491,454 and entitled, "Set Top Boxes Under Test," by Samant Kumar et al., each of which is hereby incorporated by reference in its entirety. This application is also related to U.S. patent application Serial No. 14/948,143, filed November 20, 2015 and entitled, "Cable Modems/eMTAs Under Test," by Samant Kumar et al., and to U.S. patent application Serial No. 14/948,925, filed November 23, 2015 and entitled, "Wireless Routers Under Test," by Samant Kumar et al., and to U.S. patent application Serial No. 14/929,180, filed October 30, 2015 and entitled, "Hardware Architecture for Universal Testing System: Cable Modem Test," by Samant Kumar et al., and to U.S. patent application Serial No. 14/929,220, filed October 30, 2015 and entitled, "Hardware Architecture for Universal Testing System: Wireless Router Test," by Samant Kumar et al., and to U.S. patent application Serial No. 14/987,538, filed January 4, 2016 and entitled, "Test Sequences Using Universal Testing System."

Signed and Sealed this
Thirteenth Day of February, 2018

Andrei Iancu
*Director of the United States Patent and Trademark Office*